United States Patent
La Marca et al.

(10) Patent No.: US 10,247,786 B2
(45) Date of Patent: Apr. 2, 2019

(54) METHOD FOR OPERATING A BATTERY SYSTEM, AND BATTERY MANAGEMENT SYSTEM

(71) Applicant: Robert Bosch GmbH, Stuttgart (DE)

(72) Inventors: Antonio La Marca, Leonberg (DE); Christoph Woll, Gerlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 20 days.

(21) Appl. No.: 15/434,568

(22) Filed: Feb. 16, 2017

(65) Prior Publication Data
US 2017/0242080 A1    Aug. 24, 2017

(30) Foreign Application Priority Data
Feb. 19, 2016   (DE) .................. 10 2016 202 572

(51) Int. Cl.
| | | |
|---|---|---|
| G01R 31/36 | (2019.01) | |
| B60L 11/18 | (2006.01) | |
| H02J 7/00 | (2006.01) | |

(52) U.S. Cl.
CPC ...... G01R 31/3679 (2013.01); B60L 11/1857 (2013.01); G01R 31/3651 (2013.01); G01R 31/3693 (2013.01); H02J 7/0021 (2013.01); *Y02T 10/7055* (2013.01)

(58) Field of Classification Search
CPC ............ G01R 31/3679; G01R 31/3675; G01R 31/3651; G01R 31/3606; B60L 11/1857; H02J 7/0021
See application file for complete search history.

(56) References Cited

U.S. PATENT DOCUMENTS

| | | |
|---|---|---|
| 9,056,556 B1 | 6/2015 | Hyde et al. |
| 2006/0284617 A1 | 12/2006 | Kozlowski et al. |
| 2015/0349385 A1 | 12/2015 | Hu et al. |

FOREIGN PATENT DOCUMENTS

| | | |
|---|---|---|
| DE | 10328721 A1 | 1/2005 |
| DE | 102010031337 A1 | 1/2012 |
| DE | 102011010985 A1 | 8/2012 |

OTHER PUBLICATIONS

Miguel A. Ortega-Vazquez, Optimal Scheduling of Electric Vehicle Charging and Vehicle-to-Grid Services at Household Level Including Battery Degradation and Price Uncertainty, 2014, IET Generation, Transmission & Distribution, vol. 8, Issue 6, pp. 1007-1016.*

* cited by examiner

*Primary Examiner* — Toan Le
(74) *Attorney, Agent, or Firm* — Norton Rose Fulbright US LLP; Gerard Messina

(57) ABSTRACT

A method for operating a battery system in a vehicle that includes multiple battery units is described. The method includes classifying an instantaneous aging state of the battery units, first association of the battery units with instantaneous aging classes as a function of their instantaneous aging state, predicting a future aging state of the battery units for a future point in time, second association of the battery units with future aging classes as a function of their future aging state, ascertaining an optimal point in time for replacing battery units based on a cost function, taking into account the instantaneous aging classes and the future aging classes. A battery management system that is configured for carrying out the method is also described.

9 Claims, 2 Drawing Sheets

METHOD FOR OPERATING A BATTERY SYSTEM, AND BATTERY MANAGEMENT SYSTEM

CROSS REFERENCE

The present application claims the benefit under 35 U.S.C. § 119 of German Patent Application No. DE 102016202572.4 filed on Feb. 19, 2016, which is expressly incorporated herein by reference in its entirety.

FIELD

The present invention relates to a method for operating a battery system in a vehicle that includes multiple battery units. The method according to the present invention is used for ascertaining an optimal point in time for replacing battery units. Moreover, the present invention relates to a battery management system that is configured for carrying out the method according to the present invention.

BACKGROUND INFORMATION

Present battery systems in electrically driven vehicles include multiple battery modules, and each battery module includes multiple battery cells. The battery systems are designed in such a way that the individual battery cells are connected to one another in series to be able to provide the necessary high voltage of approximately 400 V. If one battery cell fails, the battery system is no longer able to supply voltage, and the vehicle becomes disabled.

In the event of a failure of a battery cell, in present designs the entire battery system must be exchanged and replaced with a new battery system. Due to the installation process for the battery system, changing individual battery modules or individual battery cells is not possible, or is possible only with a relatively high level of effort. With modified installation processes, it is expected that even replacement of individual battery modules or individual battery cells will be possible in the future. Replacing individual battery modules or individual battery cells is generally more economical than replacing the entire battery system.

Battery systems also include a battery management system, which with the aid of suitable software is capable of recognizing different states of charge of all battery cells and making a classification of the aging state of the individual battery cells. Battery cells of the battery modules recognized as defective may be indicated as such, and replaced during maintenance operations on the vehicle.

When only defective battery modules or battery cells are replaced, this results, in particular for older battery systems, in frequent trips to the repair shop and thus high maintenance costs. The costs may be reduced when other battery modules or battery cells are replaced which have a critical aging state and which will probably fail in the near future. In addition, it may be more meaningful from an economic and environmental standpoint to replace the entire battery system instead of individual battery modules or battery cells.

An optimized strategy for replacing aged battery modules or battery cells in a battery system, or the entire battery system, based on economic and environmental considerations would be desirable.

U.S. Pat. No. 9,056,556 B1 describes a method for operating a battery system in a vehicle, and a battery management system. The battery management system includes functions for modeling and predicting the performance and for operating battery modules of the battery system.

U.S. Patent Appl. Pub. No. US 2006/0284617 A1 describes a method for classifying a battery according to its aging state. In addition, a prediction of a future aging state of the battery is provided.

SUMMARY

A method for operating a battery system in a vehicle, in particular in a motor vehicle, is provided, the battery system including multiple battery units. The battery system includes multiple battery modules, and each battery module includes multiple battery cells. Individual battery modules or also individual battery cells may be replaced during maintenance operations on the vehicle, depending on the design of the battery system. In the following discussion, a battery unit refers to battery modules as well as battery cells which may be replaced as one unit during maintenance operations on the vehicle.

The method according to the present invention comprises the following steps:

A classification of an instantaneous aging state of the battery units is initially carried out. In the classification of the instantaneous aging state of the battery units, various parameters such as the capacity of the individual battery units are determined and also evaluated. The actual state of the individual battery units of the battery system is thus ascertained by classifying the instantaneous aging state of the battery units.

A first association of the individual battery units with instantaneous aging classes is subsequently carried out as a function of the particular instantaneous aging state of the individual battery units. For this purpose, appropriate instantaneous aging classes are defined in a battery management system, each instantaneous aging class representing a stage of aging for the battery units of the battery system. After the first association of the individual battery units with the instantaneous aging classes, this results in a certain distribution of the battery units of the battery system within the instantaneous aging classes.

A prediction of a future aging state of the battery units for a future point in time is subsequently made. The probable future state of the individual battery units of the battery system is thus ascertained by predicting the future aging state of the battery units.

A second association of the battery units with future aging classes is subsequently carried out as a function of their future aging state. For this purpose, appropriate future aging classes are defined in the battery management system, each future aging class representing a stage of aging for the battery units. After the second association of the individual battery units with the future aging classes, this results in a certain distribution of the battery units of the battery system within the future aging classes.

An optimal point in time for replacing battery units is subsequently ascertained. The ascertainment of the optimal point in time for replacing battery units takes place based on a cost function, taking into account the instantaneous aging classes and the future aging classes. It is also ascertained which battery units are to be replaced, and whether it is more meaningful to replace the entire battery system.

According to one advantageous embodiment of the present invention, prior to the first association of the battery units with the instantaneous aging classes, the instantaneous aging classes are stored as historical aging classes. In particular, the historical aging classes are not discarded, but instead are retained after each first association of the battery units with the instantaneous aging classes. Thus, historical aging classes are present for each point in time at which a classification of the aging state of the battery units has been made. The stated historical aging classes may thus date back to the manufacture of the battery system.

The historical aging classes and the instantaneous aging classes are preferably taken into account for predicting the future aging state of the battery units of the battery system. In particular, all present, stored historical aging classes are taken into account for predicting the future aging state of the battery units of the battery system. The stated prediction of the future aging state of the battery units may be carried out more precisely by taking multiple historical aging classes into account.

The cost function, on the basis of which the ascertainment of the optimal point in time for replacing battery units is carried out, preferably defines a relationship between maintenance costs to be expected for the replacement as a function of a still achievable cruising range of the vehicle. In addition, even further relationships for the cost function may be defined. The stated cost function allows ascertainment of a break-even point. The break-even point indicates in particular whether, and when, replacement of individual battery units of the battery system or of the entire battery system is more economically meaningful.

According to one advantageous embodiment of the present invention, the classification of the instantaneous aging state of the battery units takes place at fixed and/or at variable time intervals. The subsequent steps are accordingly also carried out, in particular periodically, at fixed and/or at variable time intervals.

According to one alternative advantageous embodiment of the present invention, the classification of the instantaneous aging state of the battery units takes place after a fixed and/or a variable mileage of the vehicle. The subsequent steps are accordingly also carried out in each case, in particular periodically, after a fixed and/or variable mileage of the vehicle.

According to one advantageous embodiment of the present invention, a display of the battery units of the battery system that are associated with the particular instantaneous aging class takes place after the first association of the battery units with the instantaneous aging classes. In particular, the battery units of the battery system that are associated with a critical instantaneous aging class are displayed.

According to another advantageous embodiment of the present invention, a display of the battery units of the battery system that are associated with the particular future aging class takes place after the second association of the battery units with the future aging classes. In particular, the battery units of the battery system that are associated with a critical future aging class are displayed.

The display of the battery units of the battery system that are associated with a critical instantaneous aging class or a critical future aging class takes place on an output device suited for this purpose. Examples of such a suitable output device are a mobile telephone, a tablet, a notebook, an onboard computer of the vehicle, an infotainment system of the vehicle, or a specialized diagnostic device that is provided in a maintenance shop.

In addition, a battery management system is provided that is configured for carrying out the method according to the present invention. For this purpose, the battery management system according to the present invention includes in particular suitable memory areas in which the instantaneous aging classes, the future aging classes, and optionally historical aging classes are storable.

The method according to the present invention is advantageously used in an electric vehicle (EV), in a hybrid vehicle (HEV), in a plug-in hybrid vehicle (PHEV), in a light electric vehicle (LEV), or in an e-bike. In addition, a battery management system according to the present invention is advantageously used in an electric vehicle (EV), in a hybrid vehicle (HEV), in a plug-in hybrid vehicle (PHEV), in a light electric vehicle (LEV), or in an e-bike.

An example method according to the present invention allows an ascertainment of an optimized strategy for replacing aged battery units in a battery system based on economic and environmental considerations. In particular, it is possible to ascertain an optimal point in time at which individual battery units or also the entire battery system is to be replaced. The stated optimization preferably takes place with regard to the maintenance costs to be expected for replacing the battery units or the battery system as a function of a still achievable cruising range of the vehicle.

The example method according to the present invention allows a prediction to be made concerning which battery units of the battery system will probably fail within a certain time. These battery units may thus be replaced at the same time as failed battery units. The maintenance costs for replacing the battery units may be advantageously reduced in this way. It is likewise possible to make a prediction concerning whether it is more economically meaningful to replace the entire battery system instead of individual battery units. In addition, with the aid of the method according to the present invention, the situation may be prevented that battery units which probably can still be operated until the next maintenance of the vehicle are needlessly replaced.

BRIEF DESCRIPTION OF THE DRAWINGS

Specific embodiments of the present invention are explained in greater detail with reference to the figures and the description below.

DETAILED DESCRIPTION OF EXAMPLE EMBODIMENTS

Figure 1:
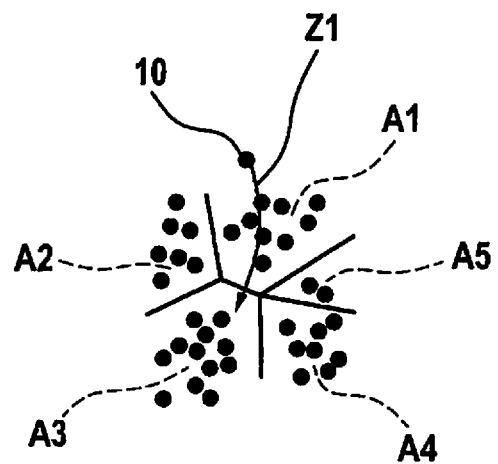
FIG. 1 shows a schematic illustration of a first association of battery units with instantaneous aging classes.

In the following description of the specific embodiments of the present invention, identical or similar elements are denoted by the same reference numerals, and a repeated description of these elements is dispensed with in individual cases. The figures illustrate the subject matter of the present invention only in a schematic fashion.

FIG. 1 shows a schematic illustration of a first association Z1 of battery units 10 with instantaneous aging classes A1, A2, A3, A4, A5. In the present case, battery units 10 are battery modules of a battery system of a vehicle, and themselves include multiple battery cells connected in series. Alternatively, battery units 10 may also represent battery cells. In the specific embodiment described here, five instantaneous aging classes A1, A2, A3, A4, A5 are provided by way of example. However, the number of instantaneous aging classes is variable. Thus, more than five or fewer than five instantaneous aging classes may also be provided.

According to the present invention, a classification of an instantaneous aging state of all battery units 10 of the battery system initially takes place. In the classification of the instantaneous aging state of battery units 10, various parameters such as in particular the capacity of individual battery units 10 are determined and also evaluated. The actual state of individual battery units 10 of the battery system is thus ascertained by classifying the instantaneous aging state of battery units 10.

First association Z1 of individual battery units 10 of the battery system with instantaneous aging classes A1, A2, A3, A4, A5 is subsequently carried out. First association Z1 takes place as a function of the particular instantaneous aging state of the particular battery unit 10.

For this purpose, in the present case a first instantaneous aging class A1, a second instantaneous aging class A2, a third instantaneous aging class A3, a fourth instantaneous aging class A4, and a fifth instantaneous aging class A5 are defined in a battery management system. Each of the instantaneous aging classes A1, A2, A3, A4, A5 represents a stage of aging for battery units 10 of the battery system. As mentioned above, more than five or fewer than five instantaneous aging classes may also be defined.

Before first association Z1 of battery units 10 with instantaneous aging classes A1, A2, A3, A4, A5 takes place, instantaneous aging classes A1, A2, A3, A4, A5 are stored as historical aging classes. Existing historical aging classes are not discarded, but instead are retained after each first association Z1 of battery units 10 with instantaneous aging classes A1, A2, A3, A4, A5. Thus, historical aging classes are present for each point in time at which a classification of the aging state of battery units 10 has been made. The historical aging classes date back to the manufacture of the battery system.

In the illustration according to FIG. 1, by way of example one of battery units 10 is associated with third instantaneous aging class A3 with the aid of first association Z1, illustrated as an arrow. After first association Z1 of individual battery units 10 with instantaneous aging classes A1, A2, A3, A4, A5, this results in a distribution of battery units 10 within defined instantaneous aging classes A1, A2, A3, A4, A5, likewise illustrated in FIG. 1.

After first association Z1 of battery units 10 with instantaneous aging classes A1, A2, A3, A4, A5, a prediction of a future aging state of battery units 10 is made for a future point in time based, for example, on cruising range, operating hours, charge cycles, etc. The probable future state of individual battery units 10 of the battery system is ascertained by predicting the future aging state of battery units 10.

The historical aging classes and instantaneous aging classes A1, A2, A3, A4, A5 are taken into account for predicting the future aging state of battery units 10 of the battery system. All present, stored historical aging classes are preferably taken into account.

Figure 2:
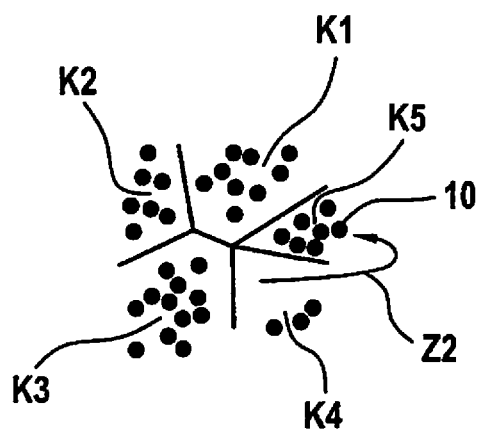
FIG. 2 shows a schematic illustration of a second association of battery units with future aging classes.

A second association Z2 of battery units 10 with future aging classes K1, K2, K3, K4, K5 is subsequently carried out as a function of their predicted future aging state. FIG. 2 shows a schematic illustration of second association Z2 of battery units 10 with future aging classes K1, K2, K3, K4, K5. In the specific embodiment described here, five future aging classes K1, K2, K3, K4, K5 are provided by way of example. However, the number of future aging classes is variable. Thus, more than five or fewer than five future aging classes may also be provided.

For this purpose, in the present case a first future aging class K1, a second future aging class K2, a third future aging class K3, a fourth future aging class K4, and a first future aging class K5 are defined in a battery management system. Each of future aging classes K1, K2, K3, K4, K5 represents a stage of aging for battery units 10 of the battery system. As mentioned above, more than five or fewer than five future aging classes may also be defined.

In the illustration according to FIG. 2, by way of example multiple battery units 10 are associated with fifth future aging class K5 with the aid of second association Z2 illustrated as an arrow. After second association Z2 of individual battery units 10 with future aging classes K1, K2, K3, K4, K5, this results in a certain distribution of battery units 10 within future aging classes K1, K2, K3, K4, K5, likewise illustrated in FIG. 2.

Figure 3:
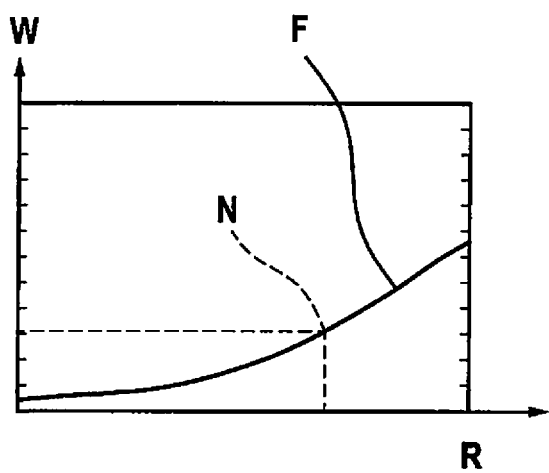
FIG. 3 shows an example of a cost function.

An optimal point in time for replacing battery units 10 is subsequently ascertained. The ascertainment of the optimal point in time for replacing battery units 10 takes place based on a cost function F, illustrated by way of example in FIG. 3. Instantaneous aging classes A1, A2, A3, A4, A5 and future aging classes K1, K2, K3, K4, K5 are hereby taken into account.

Cost function F represents a relationship between maintenance costs W to be expected for the replacement as a function of a still achievable cruising range R of the vehicle. Cost function F allows an ascertainment of a break-even point N.

Break-even point N indicates whether, and when, a replacement of individual battery units 10 of the battery system or of the entire battery system is more economically meaningful. Break-even point N is used as a guideline for the customer and for a repair shop in order to assess whether a replacement of battery units 10 is meaningful. This may also depend on additional individual, vehicle-specific factors, not mentioned here, which are incorporated in the computation or consideration.

In the present case, the classification of the instantaneous aging state of battery units 10 as well as the subsequent steps take place at fixed or at variable time intervals, and may thus be carried out periodically.

Alternatively, the classification of the instantaneous aging state of battery units 10 may be carried out after a fixed mileage or after a variable mileage of the vehicle, and may thus likewise be carried out periodically.

A display of battery units 10 of the battery system that are associated with fifth instantaneous aging class A5 takes place after first association Z1 of battery units 10 with instantaneous aging classes A1, A2, A3, A4, A5. In the present case, fifth instantaneous aging class A5 represents a critical instantaneous aging class.

A display of battery units 10 of the battery system that are associated with fifth future aging class K5 takes place after second association Z2 of battery units 10 with future aging classes K1, K2, K3, K4, K5. In the present case, fifth future aging class K5 represents a critical instantaneous [sic; future] aging class.

In the present case, battery units 10 of the battery system, which are associated with fifth instantaneous aging classes A5 or fifth future aging class K5, are displayed on an onboard computer of the vehicle. A display on a repair shop testing device, on a mobile telephone, on a tablet, on a notebook, or on an infotainment system of the vehicle is also conceivable.

The present invention is not limited to the exemplary embodiments described here and the aspects highlighted therein. Rather, numerous modifications within the cruising range set forth in the claims are possible which are within the scope of activities carried out by those skilled in the art.

What is claimed is:

1. A method for operating a battery system in a single vehicle that includes multiple battery units, comprising:
classifying a respective instantaneous aging state of each of the battery units in the single vehicle;
first association of each battery unit of the battery units with a respective instantaneous aging class of a plurality of instantaneous aging classes as a function of the respective instantaneous aging state of the battery unit;
predicting a respective future aging state of each battery unit of the battery units for a future point in time;
second association of each battery unit of the battery units with a respective future aging class of a plurality of future aging classes as a function of the respective future aging state of the battery units;
ascertaining a respective optimal point in time for replacing each battery unit of the battery units based on a cost function, taking into account the respective instantaneous aging class of the battery unit and the respective future aging class of the battery units;
selecting at least one battery unit to be replaced from among the battery units, based on the respective optimal points in time;
displaying, on a display device, the selected at least one battery unit; and
replacing, in the single vehicle, the displayed, selected at least one battery unit;
wherein the battery system of the single vehicle further includes at least one failed battery unit, and wherein the replacing step takes place at the same time the at least one failed battery unit of the single vehicle is replaced.

2. The method as recited in claim 1, wherein prior to the first association of the each battery unit of the battery units with the respective instantaneous class of the plurality of instantaneous aging classes, a respective existing instantaneous aging class of the battery unit is stored as a respective historical aging class for the battery unit.

3. The method as recited in claim 2, wherein the historical aging classes and the instantaneous aging classes are taken into account for predicting the future aging state of the battery units.

4. The method as recited in claim 1, wherein the cost function defines a relationship between maintenance costs to be expected for the replacement of the battery units as a function of a still achievable cruising range of the single vehicle.

5. The method as recited in claim 1, wherein the classification of the respective instantaneous aging state of the battery units takes place at least one of fixed time intervals and variable time intervals.

6. The method as recited in claim 1, wherein the classification of the respective instantaneous aging state of each battery of the battery units takes place after at least one of a fixed mileage of the single vehicle and a variable mileage of the single vehicle.

7. The method as recited in claim 1, wherein a display battery units that are associated with a particular ones of the plurality of instantaneous aging class takes place after the first association of each battery unit of the battery units with the instantaneous aging classes.

8. The method as recited in claim 1, wherein a display of the battery units that are associated with a particular future aging class takes place after the second association of each battery unit of the battery units with the future aging classes.

9. A method of using a battery system, comprising:
providing the battery system in a single vehicle, the single vehicle including one of an electric vehicle, a hybrid vehicle, a plug-in hybrid vehicle, and an e-bike,
classifying a respective instantaneous aging state of each of the battery units of the battery system in the single vehicle;
first association of each battery unit of the battery units with a respective instantaneous aging class of a plurality of instantaneous aging classes as a function of the respective instantaneous aging state of the battery unit;
predicting a respective future aging state of each battery unit of the battery units for a future point in time;
second association of each battery unit of the battery units with a respective future aging class of a plurality of future aging classes as a function of the respective future aging state of the battery units;
ascertaining a respective optimal point in time for replacing each battery unit of the battery units based on a cost function, taking into account the respective instantaneous aging class of the battery unit and the respective future aging class of the battery units;
selecting at least one battery unit to be replaced from among the battery units, based on the respective optimal points in time;
displaying, on a display device, the selected at least one battery unit; and
replacing, in the single vehicle, the displayed, selected at least one battery unit;
wherein the battery system of the single vehicle further includes at least one failed battery unit, and wherein the replacing step takes place at the same time the at least one failed battery unit of the single vehicle is replaced.

* * * * *